United States Patent
Ryu et al.

(10) Patent No.: US 7,478,227 B2
(45) Date of Patent: Jan. 13, 2009

(54) APPARATUS AND METHOD FOR OPTIMIZING LOOP BUFFER IN RECONFIGURABLE PROCESSOR

(75) Inventors: Soo Jung Ryu, Cheonan-si (KR); Jeong Wook Kim, Seongnam-si (KR); Suk Jin Kim, Seoul (KR); Hong-Seok Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 143 days.

(21) Appl. No.: 11/525,913

(22) Filed: Sep. 25, 2006

(65) Prior Publication Data
US 2007/0150710 A1   Jun. 28, 2007

(30) Foreign Application Priority Data
Dec. 6, 2005   (KR) .................... 10-2005-0117868

(51) Int. Cl.
*G06F 9/40* (2006.01)
(52) U.S. Cl. .......................... 712/241; 716/17
(58) Field of Classification Search ................ 712/241; 716/16, 17
See application file for complete search history.

(56) References Cited

U.S. PATENT DOCUMENTS

| 4,792,892 | A | * | 12/1988 | Mary et al. | 712/241 |
|---|---|---|---|---|---|
| 5,511,207 | A | * | 4/1996 | Ohde et al. | 712/241 |
| 5,727,194 | A | * | 3/1998 | Shridhar et al. | 712/241 |
| 6,038,649 | A | * | 3/2000 | Ozawa et al. | 711/217 |
| 6,941,539 | B2 | * | 9/2005 | Hammes | 716/16 |
| 7,194,610 | B2 | * | 3/2007 | Uriu et al. | 712/241 |
| 2004/0161162 | A1 | * | 8/2004 | Hammes | 382/262 |
| 2007/0192575 | A1 | * | 8/2007 | Moore et al. | 712/241 |

* cited by examiner

*Primary Examiner*—William M Treat
(74) *Attorney, Agent, or Firm*—Sughrue Mion, PLLC

(57) ABSTRACT

A reconfigurable processor comprising a configuration memory for storing a configuration bit for at least one loop configuration; a valid information memory for storing bit information indicating whether an operation in a loop is a delay operation; and at least one processing unit for determining whether an operation in a next cycle is the delay operation by referring to the bit information transmitted from the valid information memory, and selectively performing a change and an implementation of a configuration according to the configuration bit from the configuration memory based on the determined results.

20 Claims, 6 Drawing Sheets

APPARATUS AND METHOD FOR OPTIMIZING LOOP BUFFER IN RECONFIGURABLE PROCESSOR

CROSS-REFERENCE TO RELATED APPLICATION

This application claims priority from Korean Patent Application No. 10-2005-117868, filed on Dec. 6, 2005, in the Korean Intellectual Property Office, the disclosure of which is incorporated herein by reference.

BACKGROUND OF THE INVENTION

1. Field of the Invention

Apparatuses and methods consistent with the present invention relate to a reconfigurable processor, and more particularly to a reconfigurable processor and method for optimizing the system performance by reducing an overhead which may be necessary in accessing a loop buffer for specifying a connection establishment and an operation setting to each predefined circuit unit to implement certain functions by means of configuration bits.

2. Description of Related Art

In the related art, general-purpose digital signal processors or microprocessors are configured to implement various functions by modifying software therein. However, as these high-performance processors are used to implement various functions, load and power consumption of the processors significantly increase.

If individually dedicated circuits necessary to implement each function are employed, the load of a processor can be reduced, thereby remarkably reducing the power consumption. However, in a system employing such dedicated circuits, there is a need to design or develop a processor or a dedicated circuit according to system specifications. Therefore, the flexibility of the system using the dedicated circuit becomes lowered.

Accordingly, an attempt to use a reconfigurable processor to the recently developed high speed multimedia equipment including a ubiquitous system, or systems as such a mobile phone, a DMB (Digital Multimedia Broadcasting) phone, a personal digital assistant (PDA), or the like for transmitting and receiving high speed radio data has been actively discussed. In such reconfigurable processors, the configuration of PEs (Processing Elements), that is, a connection establishment and an operation setting may be modified by means of software. Here, the PEs may be a plurality of predefined circuit units. As one circuit unit can be implemented to various configurations according to settings modified by software, the reconfigurable processor may be applied to many different models. Consequently, increase of the flexibility, as well as reduction of the chip area and the power consumption of the processor for a set of workloads can be achieved.

FIG. 1 shows a diagram for explaining a general configuration processor 100. Referring to the figure, the configuration processor 100 includes a configuration memory 110, and a circuit array 120 also called CGA (Coarse Grained Array) which is comprised of PEs 121 suitable for a multi-configuration. The PEs 121 comprising the CGA 120 include a function unit (FU), a register file (RF), and the like. With the PEs, the multi-configuration is accomplished according to configuration bits provided from a configuration memory 110. The PEs 121 of the CGA 120 may receive data from another source, process the received data, and transmit the processed result to another destination. With the configuration data of such a configuration memory 110, the PEs 121 of the CGA 120 can implement various functions resulting in increase of flexibility.

FIG. 2 is a diagram for illustrating a scheduling of the operations for each PE when the PEs of the CGA 120 implement a certain loop operation repeatedly. Analyzing the loop operation {A, B, C, D, E, F} in an II=1 method over time, as shown in FIG. 2, a kernel 210, which is uniformly implemented in the PEs, is comprised of operations F, E, C, D, A, and B. The II is an initiation interval of the loop operation in each of the PEs, and the expression II=1 means that a new iteration of the loop begins every cycle. In the case of II=1, to simultaneously implement the six operations of the kernel 210, six PEs are required.

In the case where the loop operations {A, B, C, D, E, F} are implemented in the II=2, analyzing the loop operation over time, kernel 310, which is uniformly implemented in the PEs in each time, is comprised of operations {E, A, B} and {F, C, D}, as shown in FIG. 3, in the case of II=2, four PEs 411~414 may be implemented, as shown in FIG. 4. That is, in a first cycle 410, a first PE 411, a second PE 412 and a third PE 413 perform A, B, and E operations, and a fourth PE 414 performs a delay operation. Next, in a second cycle 420, the first PE 411, the fourth PE 414, and the third PE 413 perform C, D, and F operations, and the second PE 412 performs the delay operation.

According to the configuration bits transmitted from the configuration memory, the loop operation in the two cycles can be repeated in the PEs of the CGA 120. In addition to such loop operations, various function operations are capable according to the settings of the configuration bits.

However, as shown in FIG. 4, in the second PE 412 and the fourth PE 414, the delay operation is performed during the first cycle 410 or the second cycle 420. In other words, the configuration bits (not shown in FIG. 4) indicating the delay operation must be transmitted from the configuration memory 110 to a loop buffer of the PEs. Also the second PE 412 and the fourth PE 414 must perform the operation according to the configuration bits for the delay operation which is transmitted from the loop buffer. As mentioned above, as the II (initiation interval of the loop operation) increases, the configuration bits to be stored increase. Accordingly, it is desired to have a large loop buffer to hold the configurations as many as the II.

BRIEF SUMMARY

An aspect of the present invention provides a reconfigurable processor where a need to implement a delay operation in each circuit unit is eliminated by a memory for storing an operation information regarding validity so as to reduce access overhead and a size of a loop buffer.

Another aspect of the present invention is to provide a reconfigurable processing method which allows an operation of each circuit unit to be disabled by setting configuration bits according to the delay operation and by setting the delay operation as invalid.

According to an exemplary embodiment of the present invention, there is provided a reconfigurable processor, including: a configuration memory for storing a configuration bit for at least one loop configuration; a valid information memory for storing bit information indicating whether an operation in a loop is a delay operation; and at least one processing unit for determining whether an operation in a next cycle is the delay operation by referring to the bit information transmitted from the valid information memory, and selectively executing the operation according to the configuration bits from the configuration memory based on the determined result.

The at least one processing unit includes a loop buffer for receiving the configuration bits for at least one loop from the configuration memory, and storing it temporarily; a delay controller for generating signals indicating whether the operation of the next cycle is the delay operation by referring to the bit information transmitted from the valid information memory; and a processing element for receiving data from another source, for executing the operation with the received data according to the configuration bit from the loop buffer, and outputting the performed result into another destination, wherein, the loop buffer selectively outputs a corresponding configuration bit according to the signal generated from the delay controller, and the processing element executes the operation.

The delay controller of exemplary embodiments of the present invention controls the configuration bit(s) of the loop buffer to be outputted one at a time after counting a repeated number of times determined by the delay operations in the loop.

The loop buffer does not store the configuration bit specifying the delay operation, so idle spaces are available for other purpose, such as prefetching.

The valid information memory stores different binary data of a logical status based on whether each of the operations in the loop is the delay operation.

The configuration memory may or may not store data including the configuration bit for the delay operation in the loop.

According to another exemplary embodiment of the present invention, there is also provided a reconfigurable processing method which is using a configuration memory storing the configuration bits for at least one loop configuration in a reconfigurable processor having a plurality of processing elements, the method comprising: reading bit information for a next cycle operation from a valid information memory storing bit information indicating whether an operation in a loop is a delay operation; determining whether the next cycle operation is the delay operation by referring to the read bit information; and selectively performing an operation in each processing element according to the configuration bits from the configuration memory based on the determined result.

BRIEF DESCRIPTION OF THE DRAWINGS

The above and/or other aspects of the present invention will become apparent and more readily appreciated from the following detailed description, taken in conjunction with the accompanying drawings of which.

DETAILED DESCRIPTION OF THE EXEMPLARY EMBODIMENTS

Figure 1:
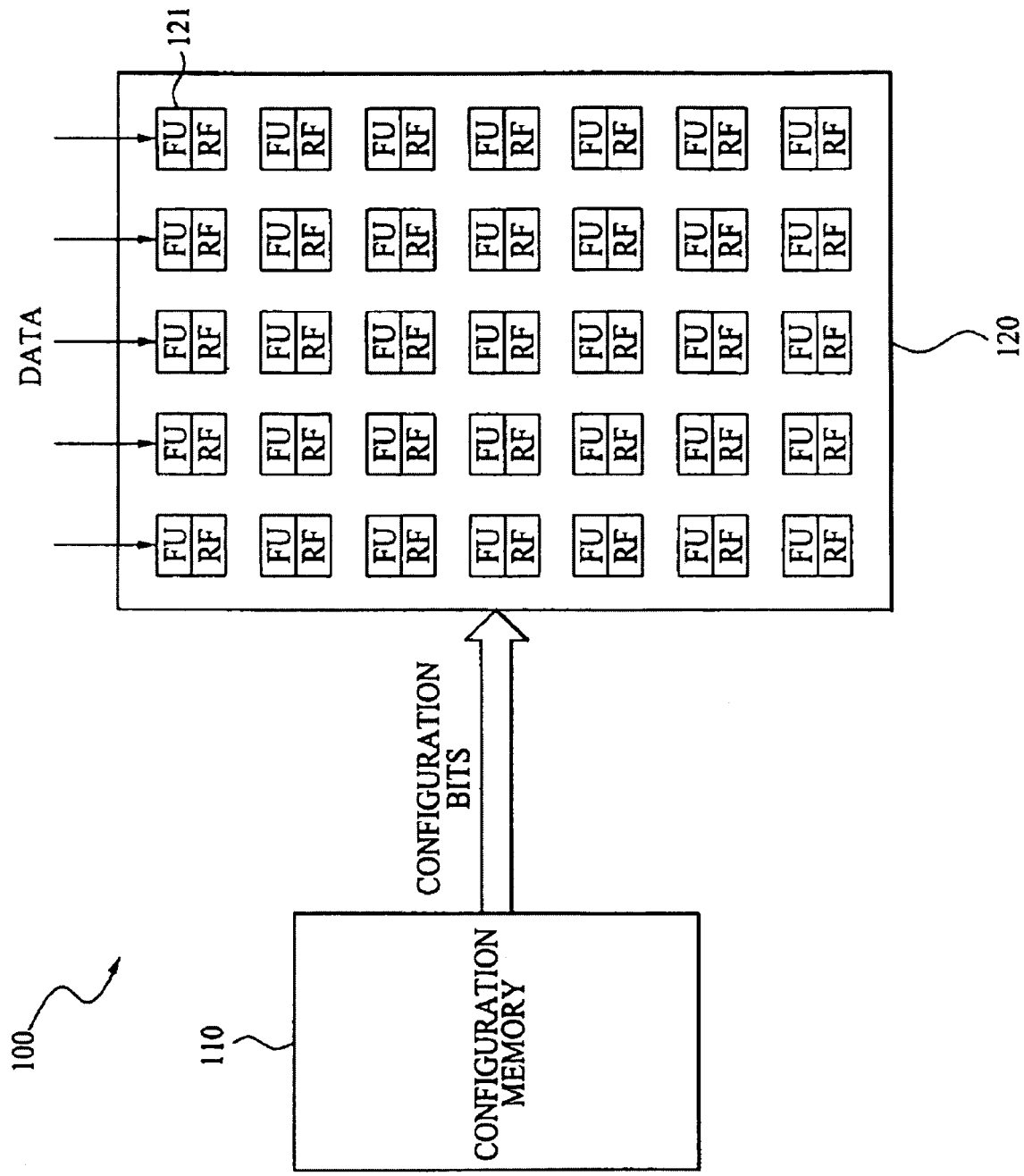
FIG. 1 is a diagram for explaining an example of a general reconfigurable processor.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 5:
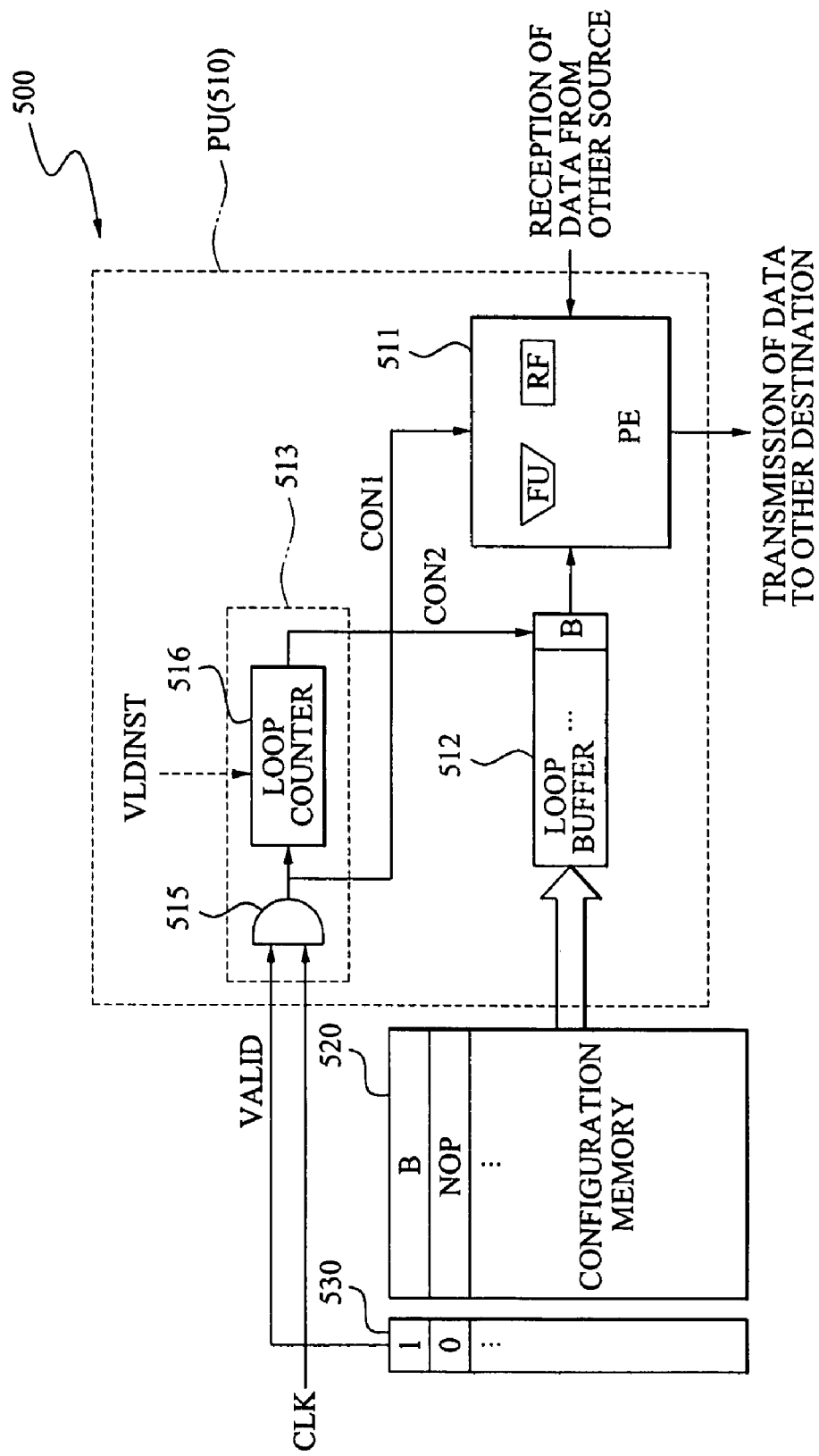
FIG. 5 is a diagram for explaining an operation of a configurable processor according to an exemplary embodiment of the present invention.

FIG. 5 is a diagram for explaining a reconfigurable processor 500 according to an exemplary embodiment of the present invention. Referring to FIG. 5, the reconfigurable processor 500 includes PU (processing unit) 510, a configuration memory 520, and a valid information memory 530.

The reconfigurable processor 500 is an efficient processor which may be applied to a multi model/context in which various configurations are implemented, because a connection establishment and an operation setting, or a configuration of an internal circuit (circuit unit) of the PU 510 are determined in a configuration memory 520. Particularly, the present invention uses a valid information memory 530 so as to reduce overhead for accessing a loop buffer and configuration memory used with a loop operation in the PU 510, in addition to a reduction of power consumption by reducing the overhead of the processor (not shown).

While only one PU 510 is illustrated for explanation in FIG. 5, the configuration processor 500 can include a plurality of PUs in a form of a CGA (Coarse Grained Array) or a FGA (Fine Grained Array). When the reconfigurable processor 500 has a plurality of PUs, the configuration memory 520 and the valid information memory 530 may support the configuration of the PUs by storing necessary information for the plurality of PUs in the corresponding allocated regions.

Here, the PUs are elementary circuit units, which can form various configurations. Although the term PU is also called PE (Processing Element), the PUs are different from the PE 511 in the PU 510.

The PE 511 comprises a FU (Function Unit), a RF (Register File), and the like. The PE 551 supports the multi-configurations depending on various configuration bits. The PE 511 can receive data from the PU, a central register file (not shown), or the like, which may be another source. Also, the PE 511 can transmit the result to another destination.

Figure 6:
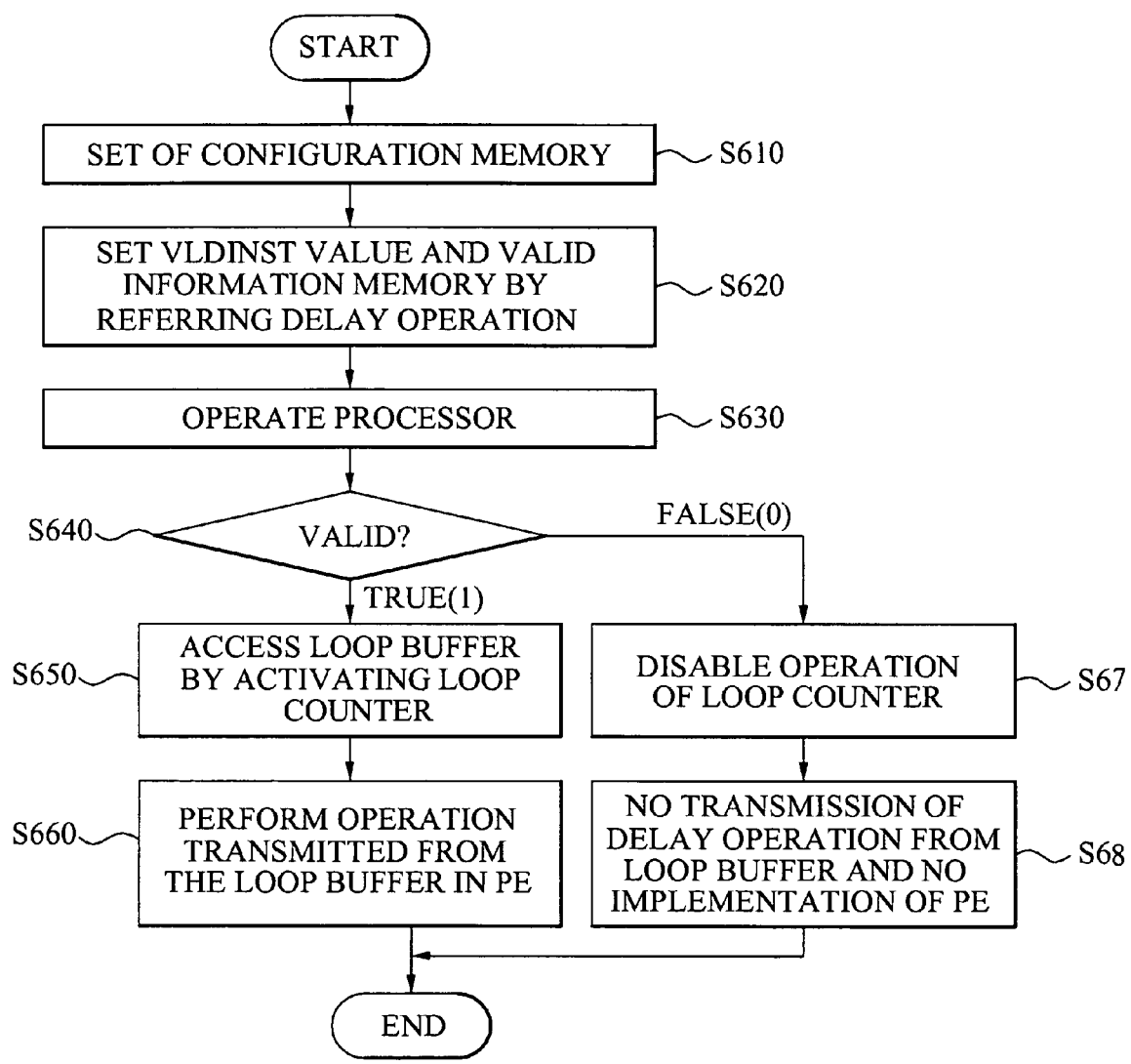
FIG. 6 is a flowchart for explaining the operation of the configurable processor in FIG. 5.

The flowchart of FIG. 6 is referred to explain the operation of the configuration processor 500 of FIG. 5.

Figure 4:
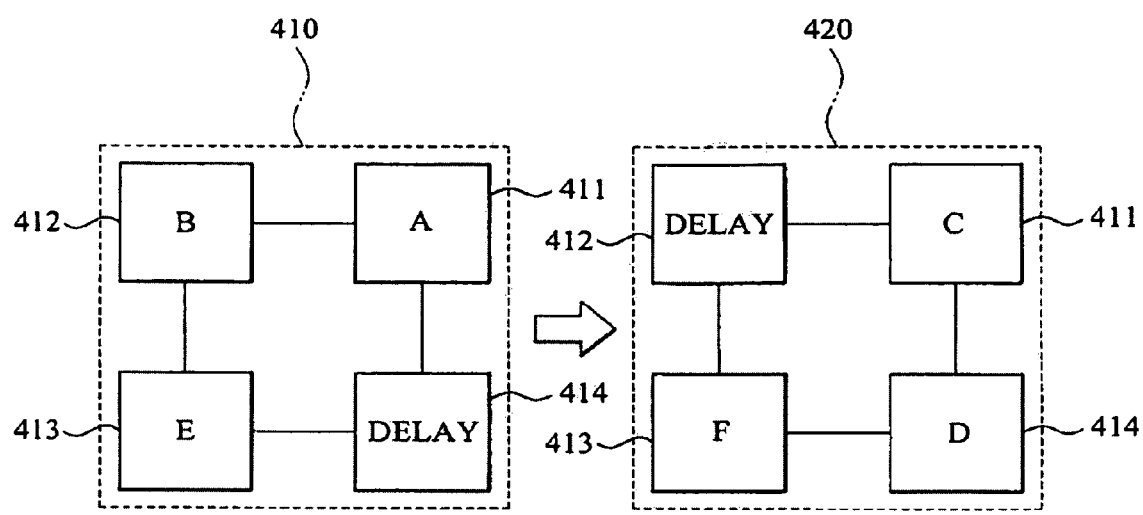
FIG. 4 is a diagram for explaining a configurable process of an operation using four PEs.

Initially, the configuration bits for various configurations which may be supported are stored in the configuration memory 520 (operation S610). In the configuration memory 520, the configuration bits for scheduling a loop operation and for implementing the operation are also repeatedly stored. As an example, in the PU 510, only adding, multiplication, and accumulation (MAC) functions can be implemented repeatedly in word basis. In the previous example shown with FIG. 4, each operation A, B, C, D, E, and F indicate adding, multiplication, and accumulation (MAC) functions.

Bit information (VALID) for supporting the various functions together with the configuration stored in the configuration memory 520 is also stored (operation S620). The bit information (VALID) stored in the valid information memory 530 is information indicating whether the operation to be executed in the PU 510 is a delay operation according to the configuration bits from the configuration memory 520. The bit information indicates whether the operation in a certain cycle in a loop operation is the operation executing the particular function, or no operation (NOP). For example, in the subsequent cycle, the valid information memory can output different binary logical data such as "1" or "0" according to whether the operation to be implemented in the PU 510 is the delay operation (NOP).

Figure 2:
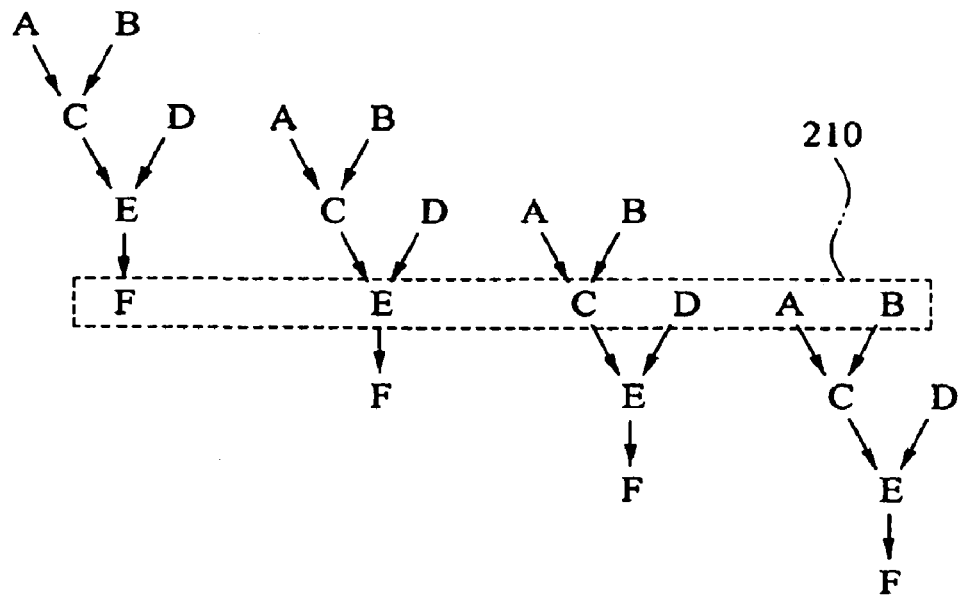
FIG. 2 is a diagram for explaining a scheduling of an II=1 for a related operation.

Also, in the delay operation, to disable the implementation of the PU 510, the repeated number of times (VLDINST) to be executed in the PU 510 has to be defined as Equation 1 below. In Equation 1, II (Initiation Interval) is an initiation interval of the loop operation. In the scheduling such as FIG. 2, II=1 indicates that a new iteration of the loop is started in every cycle. In the scheduling such as FIG. 3, II=2 indicates a that new iteration of the loop is started in every other cycle.

VLDINST=II−the number of the delay operation−1   Equation 1

As such, the setting of the configuration memory 520, the setting of the valid information memory 530, and the determination of the repeated number of times (VLDINST) may be defined in the operation of compiling a source code.

As mentioned above, when the configuration memory 520 and the valid information memory 530 are set and the circuit configuration of FIG. 5 is predetermined, the reconfigurable processor 500 can be operated with reduced overhead necessary to access a loop buffer 512 used in the PU 510, according to an exemplary embodiment of the present invention using the valid information memory 530 (operation S630).

In other words, the PU 510 determines whether the operation of the next cycle is a delay operation by referring the bit information (VALID), which is valid (invalid=0 or valid=1) or invalid (invalid=1 or valid=0), transmitted from the valid information memory 530 (operation S640). Accordingly, the PU 510, based on the determined result, selectively performs a change or an implementation of the configuration according to the configuration bits from the configuration memory 520. For example, when the bit information (VALID) is valid (invalid=0 or valid=1), the PU 510 changes the configuration according to the configuration bits of the loop buffer 512, where the configuration bits are received from the configuration memory 520 and temporarily stored. Then, the PU 510 performs the transmitted configuration. When the bit information (VALID) is invalid (invalid=1 or valid=0), the PU 510 maintains a disabled state, without any operation.

In FIG. 5, the PU 510 includes a processing element (PE) 511, a loop buffer, and a delay controller 513.

The loop buffer 512 receives and temporarily stores the configuration bits for a loop operation configuration from the configuration memory 520. The PE 511 receives data from another source, and performs an operation according to the configuration bits from the loop buffer 512. Then, the loop buffer 512 transmits the performed result to another destination.

In an exemplary embodiment of the present invention, the loop buffer 512 and the PE 511 are controlled by the delay controller 513. The delay controller 513 generates signals CON1 and CON2 representing whether the operation of the next cycle is the delay operation by referring to the bit information (VALID) transmitted from the valid information memory 530.

The delay controller 513 includes a logical product (AND) logic gate 515 and a loop counter 516. The logical product logic gate 515 generates a first control signal CON1 by comparing the bit information (VALID) with a clock signal (CLK) indicating cycle. The PE 511 selectively performs an operation based on the logical state of the first control signal CON1.

The loop counter 516 generates a second control signal CON2 by selectively counting based on the first control signal CON1. Accordingly, the loop buffer 512 selectively outputs the configuration bits to the PE 511, based on the second control signal CON2 which corresponds to the count value.

For example, when the bit information (VALID) is valid (invalid=0 or valid=1) in the next cycle, the loop counter 516 transmits to the loop buffer 512 the second control signal CON2 having a count value incremented by one. Accordingly, the loop buffer 512 reads the configuration bits for the subsequent operation and transmits the read bits to the PE 511 (operation S650). The PE 511, which received the configuration bits for the subsequent operation from the loop buffer 512, is changed into a suitable configuration for performance (operation S660).

However, when the bit information is invalid (invalid=1 or valid=0) in the next cycle, the logical product logic gate 515 outputs the first control signal CON1 having a non-activation status. In this case, the count operation of the loop counter 516 also becomes disabled (operation S670). Consequently, the loop buffer 512 does not output the configuration bits for the subsequent operation. The PE 511 becomes disabled, so no configuration change is performed (operation S680).

Figure 3:
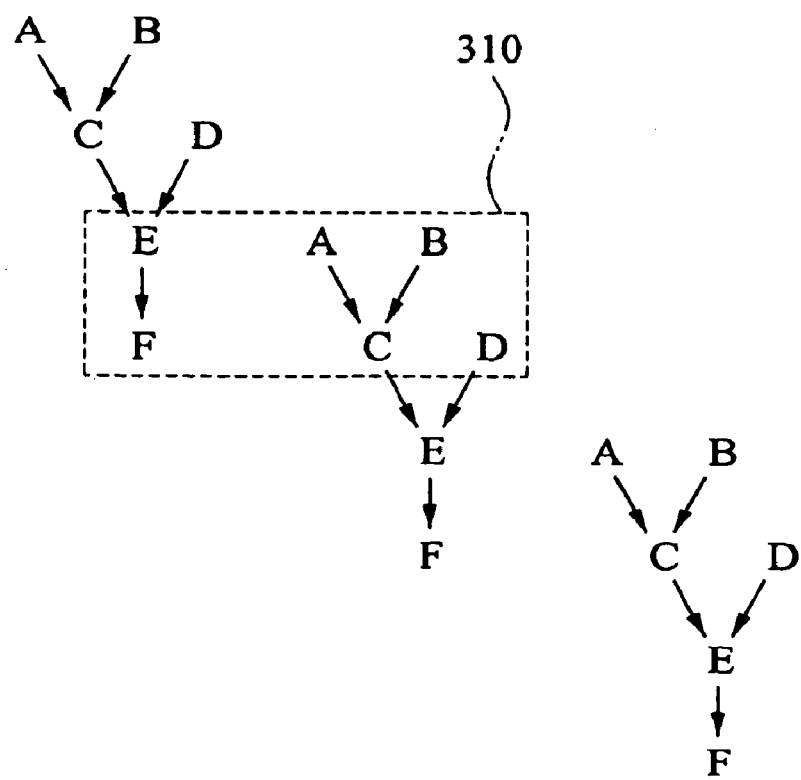
FIG. 3 is a diagram for explaining a scheduling of an II=2 for a related operation.

The case that the loop operation {A, B, C, D, E, F} is in II=2, as shown in FIG. 3, will be explained. In the figure, kernel 310, which is comprised of operation E, A, B, F, C, and D, can be performed in four PUs of FIG. 5, according to an exemplary embodiment of the present invention.

Figure 7:
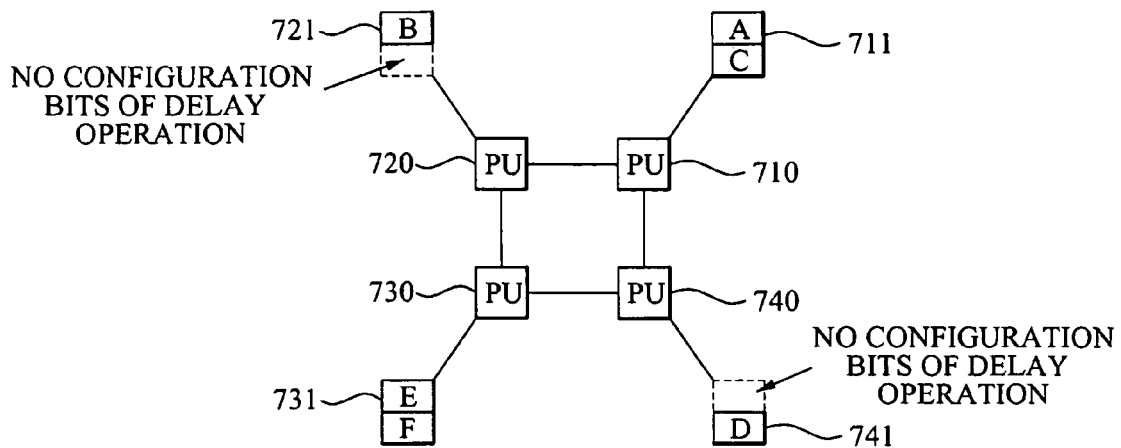
FIG. 7 is a diagram illustrating that the configuration bits for the delay operation need not be transmitted to a loop buffer according to an exemplary embodiment of the present invention.
Figure 8:
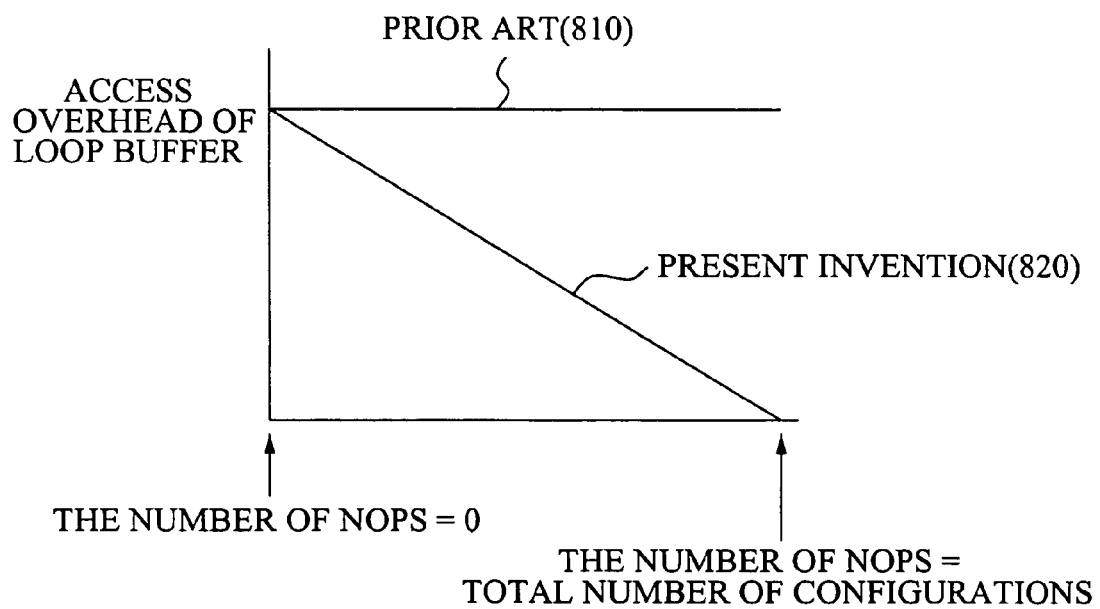
FIG. 8 is a graph illustrating a relation between the rate of the operation application of the delay operation and the access overhead of the loop buffer according to an exemplary embodiment of the present invention.

As shown in FIG. 7, each of the PEs of a first PU 710, a second PU 720, and a third PU 730 receive the configuration bits for the operation A, B and E from each of the loop buffers 711, 721 and 731, and perform the corresponding operations. In this case, the PE of a fourth PU 740 does not receive the configuration bits for the delay operation from the loop buffer 741, thereby being disabled. As shown in FIG. 7, the PE of the fourth PU 740 does not perform a configuration change for the delay operation.

In a next cycle, each of the PEs of the first PU 710, the fourth PU 740 and the third PU 730 receive the configuration bits for the operation C, D and F from each of the loop buffers 711, 741 and 731, and perform the corresponding operations. In this case, the PE of the second PU 720 does not receive the configuration bits for the delay operation from the loop buffer 721, thereby being disabled. As shown in FIG. 7, the PE of the second PU 720 does not perform a configuration change for the delay operation.

Consequently, it is appreciated that the delay controller 513 counts the repeated number of times (VLDINST) of the Equation 1 determined by the number of the delay operations in the loop. That is, in the example mentioned above, the delay operation is not performed in the first PU 710 and the third PU 730, and then all the configuration bits of the loop buffer are outputted to the corresponding PE in count 0 and count 1 when VLDINST=1. However, the delay operations are performed in the second PU 720 and the fourth PU 740, and then the configuration bits of the loop buffer are outputted to the corresponding PE only in count 0 when VLDINST=1.

As such, according to an exemplary embodiment of the present invention, the configuration bits indicating the delay operation may not be stored in the loop buffer 512. Consequently, idle spaces are available for other purpose, such as prefetching. Furthermore, the delay operation may consume less power than the related method which always accesses the loop buffer to read the configuration bits.

Therefore, in the related art 810, access overhead of the loop buffer is very large because the delay operation always has to be performed. However, in the present invention, the access overhead of the loop buffer becomes smaller as the number of the delay operations becomes large.

In FIG. 5, the configuration memory 520 may or may not store data including the configuration bits for the delay operation in the loop. If the configuration memory 520 does not include the configuration bits for the delay operation in the loop, the overhead of the configuration memory to read and write the configuration bits is significantly reduced, thereby increasing available spaces. If the configuration bits for the delay operation are not stored in the configuration memory 520, by suitably controlling a predetermined program counter which controls the output of the configuration memory 520, for example, the delay operation is not allowed to count, it is appreciated in the art that the required data can be transmitted from the configuration memory 520 to the loop buffer 512.

As mentioned above, the reconfigurable processor 500, according to an exemplary embodiment of the present invention, comprises the valid information memory 530 indicating whether the delay operation is necessary, in addition to the configuration memory 520 providing the configuration bits for performing a series of the operation. In the PU 510, when the delay controller 513 determines whether the next operation is a delay operation by referring to the bit information (VALID) transmitted from the valid information memory 530, implementation of the PE 511 is disabled for the delay operation. Also, the loop buffer 512 does not provide the configuration bits transmitted from the configuration memory 520. Thus, the configuration bits specifying the delay operation may not be stored to the loop buffer 512.

The functions used in the method and the apparatus disclosed in the specifications may be embodied as a program instruction capable of being executed via various computer units and may be recorded in a computer readable recording medium. The computer readable medium may include a program instruction, a data file, and a data structure, separately or cooperatively. The program instructions and the media may be those specially designed and constructed for the purposes of the present invention, or they may be of the kind well known and available to those skilled in the art of computer software arts. Examples of such computer readable media include magnetic media (e.g., hard disks, floppy disks, and magnetic tapes), optical media (e.g., CD-ROMs or DVD), magneto-optical media (e.g., floptical disks), and hardware devices (e.g., ROMs, RAMs, or flash memories, etc.) that are specially configured to store and perform program instructions. The media may also be transmission media such as optical or metallic lines, wave guides, etc. including a carrier wave transmitting signals specifying the program instructions, data structures, etc. Examples of the program instructions include both machine code, such as produced by a compiler, and files containing high-level languages codes that may be executed by the computer using an interpreter. The hardware elements above may be configured to act as one or more software modules for implementing the operations of this invention, and its reverse is also true.

As mentioned above, in the reconfigurable processor and method for optimizing the system performance thereof according to an exemplary embodiment of the present invention, as the delay operation need not be implemented in each processing unit, the overhead and the size of the loop buffer can be greatly reduced, thereby reducing the power consumption. The reconfigurable processor according to the an exemplary embodiment of present invention can be applied to recent high speed multimedia equipment including the ubiquitous system, or systems as such a mobile phone, a DMB (Digital Multimedia Broadcasting) phone, a PDA (personal digital assistant), or the like for transmitting and receiving high speed radio (wireless) data. Accordingly, the performance of the system may be improved.

The functions used in the method and the apparatus disclosed in the specifications may be embodied as a program instruction capable of being executed via various computer units and may be recorded in a computer readable recording medium. The computer readable medium may include a program instruction, a data file, and a data structure, separately or cooperatively. The program instructions and the media may be those specially designed and constructed for the purposes of the present invention, or they may be of the kind well known and available to those skilled in the art of computer software arts. Examples of such computer readable media include magnetic media (e.g., hard disks, floppy disks, and magnetic tapes), optical media (e.g., CD-ROMs or DVD), magneto-optical media (e.g., floptical disks), and hardware devices (e.g., ROMs, RAMs, or flash memories, etc.) that are specially configured to store and perform program instructions. Examples of the program instructions include both machine code, such as produced by a compiler, and files containing high-level languages codes that may be executed by the computer using an interpreter. The hardware elements above may be configured to act as one or more software modules for implementing the operations of this invention, and its reverse is also true

What is claimed is:

1. A reconfigurable processor, comprising:
    a configuration memory which stores a configuration bit for at least one loop configuration;
    a valid information memory which stores bit information indicating whether an operation in a loop is a delay operation; and
    at least one processing unit which determines whether an operation in a next cycle is the delay operation by referring to the bit information from the valid information memory, and selectively executing the operation according to the configuration bit from the configuration memory based on the determination.

2. The reconfigurable processor of claim 1, further comprising:
    a loop buffer which receives the configuration bit for at least one loop configuration from the configuration memory, and storing the configuration bit temporarily;
    a delay controller which generates signals indicating whether the operation of the next cycle is the delay operation by referring to the bit information transmitted from the valid information memory; and
    a processing element which receives data from another source, executes the operation with the received data according to the configuration bit from the loop buffer, and outputs the performed result into another destination,
    wherein the loop buffer selectively outputs a corresponding configuration bit according to the signal generated from the delay controller, and the processing element executes the operation.

3. The reconfigurable processor of claim 2, wherein the delay controller controls the configuration bit of the loop buffer to be outputted one at a time after counting a repeated number of times determined by the delay operations in the loop, by counting as many of the configuration bits as a repeated number of times of the delay operations in the loop.

4. The reconfigurable processor of claim 3, wherein the repeated number of times is determined 1 as follows:

VLDINST=II−the number of the delay operations−1 where VLDINST is the repeated number of times and II is an initiation interval.

5. The reconfigurable processor of claim 2, the delay controller comprising:
a logic gate which compares the bit information with a clock signal indicating a cycle to generate a first control signal; and
a loop counter which selectively counting according to the first control signal to generate a second control signal, wherein the loop buffer selectively outputs the configuration bit according to the first control signal, and the processing element selectively performs the operation according to the first control signal.

6. The reconfigurable processor of claim 5, wherein the logic gate is an AND logic gate.

7. The reconfigurable processor of claim 2, wherein the loop buffer does not store a configuration bit specifying the delay operation.

8. The reconfigurable processor of claim 1, wherein the valid information memory stores different binary data of a logical status based on whether each of the operations in the loop is the delay operation.

9. The reconfigurable processor of claim 1, wherein the configuration memory stores data including the configuration bit for the delay operation in the loop.

10. The reconfigurable processor of claim 1, wherein the configuration memory does not include a configuration bit for the delay operation in the loop.

11. A reconfigurable processing method using a configuration memory storing configuration bits for at least one loop configuration in a reconfigurable processor having a plurality of processing elements, the method comprising:
reading bit information for a next cycle operation from a valid information memory storing bit information indicating whether an operation in a loop is a delay operation;
determining whether the next cycle operation is the delay operation by referring to the bit information; and
selectively performing an operation in each processing element according to the configuration bits from the configuration memory based on the determination.

12. The reconfigurable processing method of claim 11, further comprising:
receiving the configuration bits for the at least one loop configuration from the configuration memory, and temporarily storing the configuration bits in a loop buffer;
generating signals which indicate whether the next cycle operation is the delay operation based on the bit information from the valid information memory;
selectively outputting corresponding configuration bits from the loop buffer based on the signals indicating that the next cycle operation is the delay operation; and
selectively performing a change and an implementation of the configuration in each processing element according to the signals indicating that the next cycle operation is the delay operation.

13. The reconfigurable processing method of claim 12, further comprising:
outputting the configuration bits of the loop buffer one at a time by counting as many of the configuration bits as a repeated number of times of the delay operations in the loop.

14. The reconfigurable processing method of claim 13, wherein the repeated number of times is determined as follows:

VLDINST=II−the number of the delay operations−1 where VLDINST is the repeated number of times and II is an initiation interval.

15. The reconfigurable processing method of claim 12, further comprising:
comparing the bit information with a clock signal indicating a cycle to generate a first control signal;
selectively counting according to the first control signal to generate a second control signal;
selectively outputting the configuration bits according to the second control signal; and
selectively performing the change and the implementation of the configuration in each processing element according to the first control signal.

16. The reconfigurable processing method of claim 12, wherein the loop buffer does not store the configuration bits specifying the delay operation.

17. The reconfigurable processing method of claim 11, wherein the valid information memory stores different binary data of a logical status based on whether each of the operations in the loop is the delay operation.

18. The reconfigurable processing method of claim 11, wherein the configuration memory stores data including configuration bits for the delay operation in the loop.

19. The reconfigurable processing method of claim 11, wherein the configuration memory does not include configuration bits for the delay operation in the loop.

20. A computer readable recording medium having a program recorded therein, where the program performs a reconfigurable processing in a reconfigurable processor including a configuration memory storing a configuration bit for at least one loop configuration and a plurality of processing elements, the reconfigurable processing comprising:
reading bit information for a next cycle operation from a valid information memory storing bit information indicating whether an operation in a loop is a delay operation;
determining whether the next cycle operation is the delay operation by referring to the read bit information; and
performing an operation in each processing element according to the configuration bits from the configuration memory based on the determined result.

* * * * *